US006137270A

United States Patent [19]

Nakanishi et al.

[11] Patent Number: 6,137,270

[45] **Date of Patent: *Oct. 24, 2000**

[54] BUZZER DRIVING DEVICE

[75] Inventors: Mamoru Nakanishi; Morihiko Toyozumi, both of Yokkaichi, Japan

[73] Assignee: Sumitomo Wiring Systems, Ltd., Japan

[ * ] Notice: Under 35 U.S.C. 154(b), the term of this patent shall be extended for 638 days.

[21] Appl. No.: 08/497,227

[22] Filed: Jun. 30, 1995

[30] Foreign Application Priority Data

Jul. 1, 1994 [JP] Japan .................................... 6-151057

[51] Int. Cl.[7] ................................ H02J 7/16; B60Q 1/00; H03K 3/12

[52] U.S. Cl. ........................ 320/157; 340/457.1; 327/205

[58] Field of Search ................................ 320/2, 107, 155, 320/157, 158, 159; 340/457.1; 327/205, 206, 210

[56] References Cited

U.S. PATENT DOCUMENTS 3,965,373 6/1976 Carlson .
4,188,549 2/1980 Dorais ..................................... 307/308
4,246,572 1/1981 Larsen .
4,369,381 1/1983 Okamoto et al. ....................... 327/205
4,803,459 2/1989 Ta ......................................... 340/457.1

FOREIGN PATENT DOCUMENTS 2 468 483 of 1981 France .

*Primary Examiner*—Peter S. Wong
*Assistant Examiner*—Gregory J. Toatley, Jr.
*Attorney, Agent, or Firm*—Anthony J. Casella; Gerald E. Hespos; Michael J. Porco

[57] ABSTRACT

To prevent an erroneous operation of a buzzer upon fall of a source voltage, a buzzer driving device connectable with a direct current source (1) comprises a charging/discharging circuit (3) which is connected with the direct-current source (1) via a switch (2) and performs the charging and discharging at a predetermined time constant (CR) when the switch (2) is turned on and off, respectively, a hysteresis circuit (25) to which an output voltage of the charging/discharging circuit (3) is input and which operates until the output voltage rises to or above an operation threshold value ($V_T$) after the start of the charging of the charging/discharging circuit (3) and thereafter remains inoperative unless the output voltage falls to or below a stop threshold value ($V_S$) which is smaller than the operation threshold value ($V_T$) due to the discharging of the charging/discharging circuit (3), and a driving circuit (14) for outputting a drive signal for a buzzer (15) in response to the operation of the hysteresis circuit (25).

6 Claims, 5 Drawing Sheets

BUZZER DRIVING DEVICE

BACKGROUND OF THE INVENTION

1. Field of the Invention

The present invention relates to a buzzer driving device for driving a buzzer for a predetermined time after a switch is turned on.

2. Description of the Prior Art

Prior art buzzer driving devices for driving a warning buzzer when a seat belt of an automotive vehicle is not worn are constructed, for example, as shown in FIGS. 4 and 5.

As shown in FIG. 4, a series circuit consisting of a first resistor 3$a$ used for the charging and discharging and a capacitor 3$b$ are connected via an ignition switch 2 with a battery 1 of the automotive vehicle, which is a direct-current source, thereby forming a charging/discharging circuit 3. An emitter of a PNP transistor 5 is connected with the battery 1 via the ignition switch 2, a base thereof is connected with a common contact of the first resistor 3$a$ and the capacitor 3$b$ via a second resistor 6 for applying a bias to the base, and a collector thereof is grounded via a third resistor 7.

A diode 8 is connected in the reverse direction in parallel with the first resistor 3$a$. A fourth resistor 9 used for the discharging is connected between a cathode of the diode 8 and an earth. The collector of the transistor 5 is also connected with an input terminal of an inverter 10. One input terminal of a NOR gate 11 is connected with an output terminal of the inverter 10, and the other input terminal thereof is grounded via a buckle switch 12 which is turned on when the seat belt is not worn. An output terminal of the NOR gate 11 is connected with an input terminal of an oscillator 13 which forms a driving circuit 14 together with the inverter 10 and the NOR gate 11. A warning buzzer 15 is driven in response to an oscillatory output from the oscillator 14. Identified by 16 is a fifth resistor.

In another prior art shown in FIG. 5, an inverter 17 is provided in place of the transistor 5 and the third resistor 7 of FIG. 4. A source terminal of the inverter 17 is connected with a battery 1 via an ignition switch 2, an input terminal thereof is connected via a second resistor 6 with a contact of a first resistor 3$a$ and a capacitor 3$b$, and an output terminal thereof is connected with an input terminal of the inverter 10.

In the construction of FIG. 4, when the ignition switch 2 is turned on while the buckle switch 12 is on because the seat belt is not worn, the voltage at point A at one end of the first resistor 3$a$, i.e., at its end leading to the ignition switch 2, rises to a source voltage $V_{BAT}$ of the battery 1 as shown in FIG. 6($a$). At this stage, the transistor 5 is turned on at the same time when the ignition switch 2 is turned on, with the result that the voltage at point C where the collector of the transistor 5 is located rises as shown in FIG. 6($c$).

Since the capacitor 3$b$ is charged by a current from the battery 1 via the first resistor 3$a$, the voltage at point B at the other end of the first resistor 3$a$, i.e. at its end leading to the capacitor 3$b$ rises at a time constant (=CR) determined by a resistance value (=R) of the first resistor 3$a$ and a capacity (=C) of the capacitor 3b as shown in FIG. 6($b$). The transistor 5 is turned off when the voltage at point B rises to or above a threshold value $V_t$, and the voltage at point C falls as shown in FIG. 6($c$). Thus, the NOR gate 11 is in its operative state only for a period T (see FIG. 6($c$)) during which the transistor 5 is on. While the NOR gate 11 is in its operative state, the buzzer 15 is driven by the oscillator 13. The buzzer 15 makes buzzing sounds during the predetermined period (period T) immediately after the start of the engine following the turning-on of the ignition switch 2, thereby notifying passenger(s) of the automotive vehicle that seat belt(s) is/are not worn.

The construction of FIG. 5 operates similarly to the above construction. Specifically, the voltages at points A and B, i.e., at the opposite ends of the first resistor 3$a$ and the voltage at point C' which corresponds to point C in FIG. 4 and is an output terminal of the inverter 10 vary as shown in FIGS. 6($a$), 6($b$) and 6($c$), respectively.

However, with the constructions of FIGS. 4 and 5, the buzzer 15 may mistakenly operate in the following case because the threshold value ($V_t$) of the transistor 5 or the inverter 17 is constant. When the seat belt is left unworn even after the warning by the buzzer 15, the source voltage may temporarily fall for a certain reason, thereby causing the voltage at point B to fall to or below the threshold value as shown in FIG. 6($b$). When the source voltage returns to its previous level thereafter, the buzzer 15 is driven for the predetermined period T in the same way as when the ignition switch 2 is turned on, with the result that the buzzer operates when it should not.

An object of the invention is to avoid an erroneous operation of the buzzer.

SUMMARY OF THE INVENTION

According to the invention, the hysteresis circuit operates until the output voltage rises to or above the operation threshold value after the start of the charging of the charging/discharging circuit and thereafter remains inoperative unless the output voltage falls to or below the stop threshold value which is smaller than the operation threshold value, due to the discharging of the charging/discharging circuit. The buzzer operates in response to the drive signal from the driving circuit while the hysteresis circuit operates. Accordingly, the buzzer will not operate even if the source voltage falls for a certain reason, unless the output voltage of the charging/discharging circuit returns to its original level after falling to or below the stop threshold value. Thus, unlike the prior art buzzer driving circuits, there can be prevented an erroneous operation of the buzzer in which the buzzer operates when it should not.

According to an alternative embodiment, the charging/discharging circuit may be constituted by an integrating circuit or the like.

The charging/discharging circuit may comprise a series circuit may comprise a charging/discharging resistor and a capacitor. The hysteresis circuit may comprise a first inverter having an input terminal connected with a contact of the charging/discharging resistor and the capacitor via a voltage dividing resistor and an output terminal connected with an input terminal of the driving circuit. The hysteresis circuit may further comprise a second inverter having a source terminal connected with the direct-current source via the switch, an input terminal connected with the output terminal of the first inverter, and an output terminal connected with the input terminal of the first inverter via another voltage dividing resistor.

There can be provided a buzzer driving device free from erroneous operations by constituting the charging/discharging circuit by the series circuit including the resistor and the capacitor and by constituting the hysteresis circuit by the first and second inverters such as CMOS inverters and the two voltage dividing resistors.

BRIEF DESCRIPTION OF THE DRAWINGS

These and other objects, features and advantages of the present invention will become more apparent upon a reading of the following detailed description and accompanying drawings in which.

DETAILED DESCRIPTION OF THE PREFERRED EMBODIMENT

Figure 1:
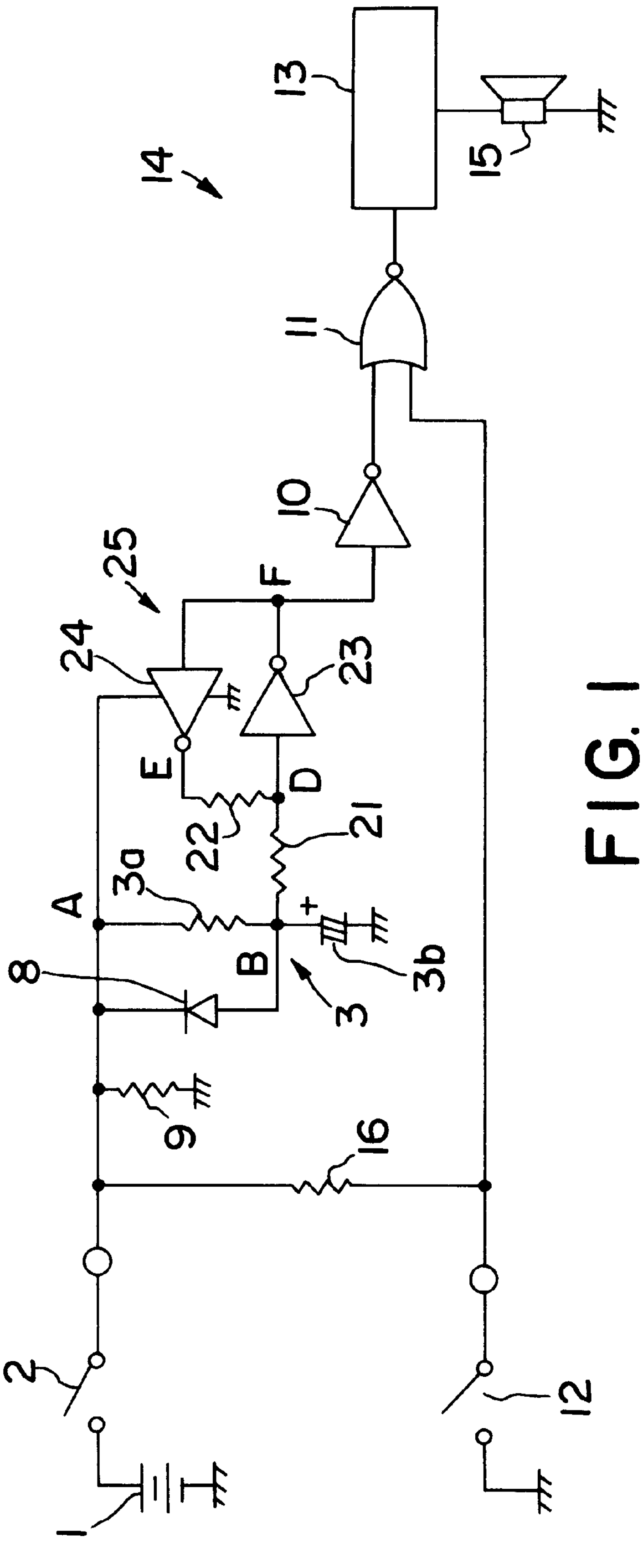
FIG. 1 is a connection diagram of one embodiment according to the invention.
Figure 4:
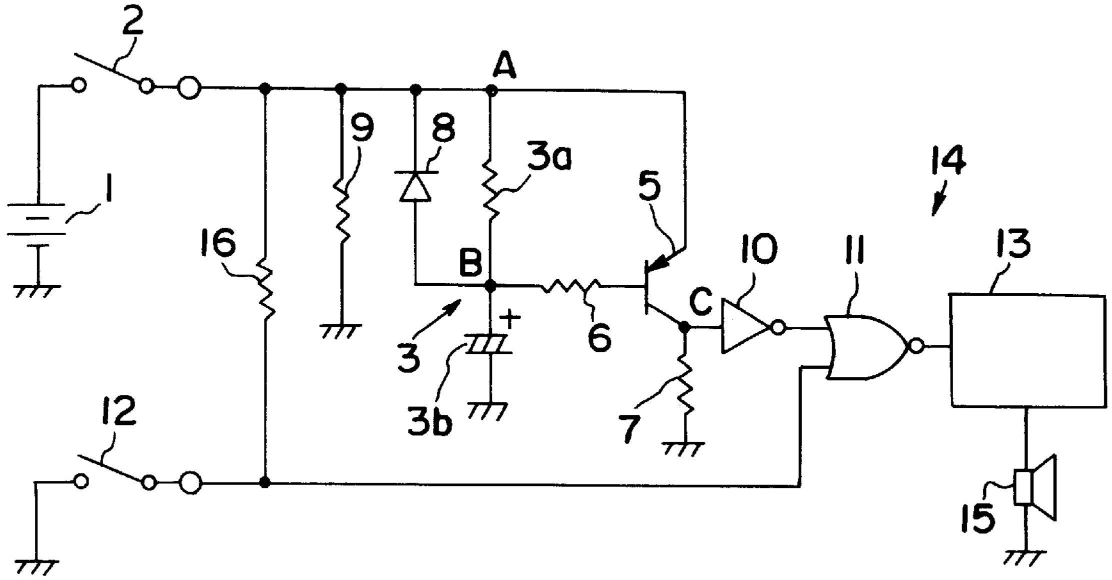
FIG. 4 PRIOR ART
FIG. 4 is a connection diagram of a prior art buzzer driving device.

In FIG. 1, like or corresponding elements are identified by like reference numerals as in FIG. 4. FIG. 1 differs from FIG. 4 in that a hysteresis circuit 25 is provided in place of the second and third resistors 6 and 7 and the transistor 5.

A charging voltage from the capacitor 3*b* which is an output voltage of a charging/discharging circuit 3 is supplied to the hysteresis circuit 25. The hysteresis circuit 25 operates until the charging voltage rises to or above an operation threshold value $V_T$ (see FIGS. 2 and 3) after the charging of the capacitor 3*b* is started. Thereafter, the hysteresis circuit 25 remains inoperative even if the charging voltage of the capacitor 3*b* returns to its previous level, after falling below the operation threshold value $V_T$, unless the charging voltage of the capacitor 3*b* falls to or below a stop threshold value $V_S$ which is lower than the operation threshold value $V_T$ due to the discharging of the capacitor 3*b*. An oscillation signal is output from an oscillator 13 in response to the operation of the hysteresis circuit 25, thereby causing a buzzer 15 to operate.

Figure 2:
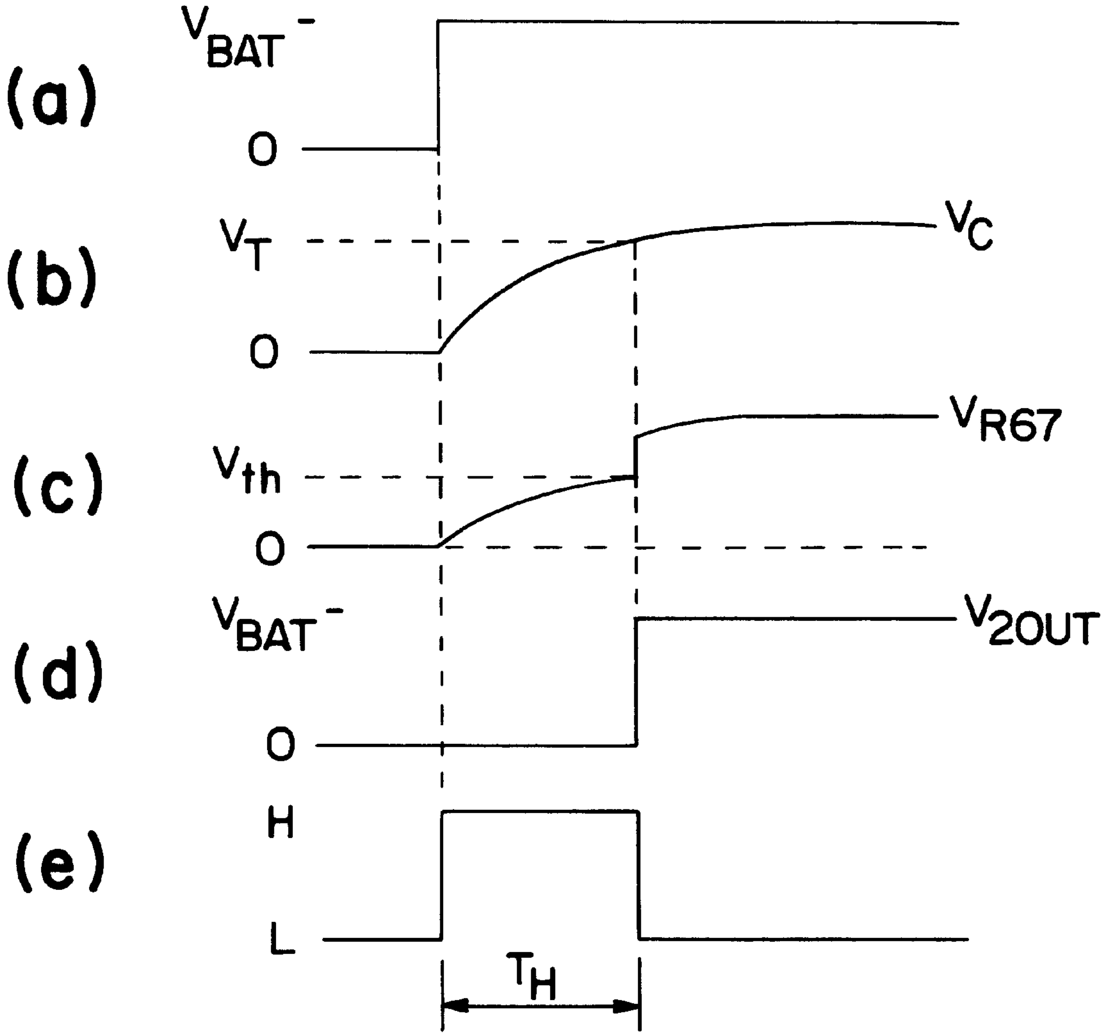
FIG. 2 is a chart showing the operation of the embodiment.

In the construction of FIG. 1, when the ignition switch 2 is turned on while the buckle switch 12 is on because the seat belt is not worn, the voltage at point A at one end of the first resistor 3*a*, i.e., at its end leading to the ignition switch 2 rises to the source voltage $V_{BAT}$ as shown in FIG. 2(*a*), and the voltage at point F which is the output terminal of the first CMOS inverter 23 rises to high-level (hereafter, H-level) as shown in FIG. 2(*e*) at the same time when the ignition switch 2 is turned on.

Since the capacitor 3*b* is charged by a charging current from the battery 1 via the first resistor 3*a*, a charging voltage $V_C$ at point B at the other end of the first resistor 3*a*, i.e., at its end leading to the capacitor 3*b* rises at a time constant (=CR) determined by a resistance value (=R) of the first resistor 3*a* and a capacity (=C) of the capacitor 3*b* as shown in FIG. 2(*b*). When the voltage at point B rises to or above the operation threshold value $V_T$ of the hysteresis circuit 25, the output of the first CMOS inverter 23 inverts from H-level to low level (hereinafter, L-level) and the voltage at point F falls to L-level as shown in FIG. 2(*e*).

At this stage, the charging voltage $V_C$ of the capacitor 3*b* is expressed as in Equation 1, wherein $R_6$ and $R_7$ denote the resistance values of the sixth and seventh resistors 21 and 22, respectively, and $V_{th}$ denotes a threshold value of the CMOS gates of the inverter 23.

$$V_C = \frac{V_{th} \times (R_6 + R_7)}{R_7} \quad (1)$$

The voltage at point D which is a contact of the sixth and seventh resistors 21 and 22 is $V_{R67}$ obtained by dividing a difference between the charging voltage $V_C$ of the capacitor 3*b* and an output voltage $V_{2OUT}$ of the second CMOS inverter 24 by means of the resistors 21 and 22. The voltage $V_{R67}$ varies as shown in FIG. 2(*c*). When the voltage $V_{R67}$ reaches a threshold value $V_{th}$ of the CMOS gates of the CMOS inverters 23 and 24, the logic of the CMOS gates inverts, thereby changing the output of the CMOS gates from H-level to L-level. The output voltage $V_{2OUT}$ of the second CMOS inverter 24 varies as shown in FIG. 2(*d*).

By the above-mentioned inversion of the logic of the CMOS gates, the voltage $V_{R67}$ at point D rises and stabilizes in accordance with Equation 2.

$$V_{R67} = (V_{2OUT} - V_c) \times \frac{R_6}{R_6 + R_7} + V_C \quad (2)$$

Equation 2 can be rewritten as follows if the output voltage $V_{2OUT}$ of the second inverter 24 is equal to the source voltage $V_{BAT}$ of the battery 1.

$$V_{R67} = (V_{BAT} - V_C) \times \frac{R_6}{R_6 + R_7} + V_C \quad (3)$$

Thus, a NOR gate 11 is in its operative state only for a period TH (see FIG. 2(*e*)) during which the hysteresis circuit 25 operates in providing an H-level output voltage at point F. The buzzer 15 is driven by the oscillator 13 during that period. In this way, the buzzer 15 makes buzzing sounds for the predetermined period (period TH) immediately after the start of the engine following the turning-on of the ignition switch 2, thereby notifying the passenger(s) that the seat belt(s) is/are not worn.

If the source voltage falls for a certain reason thereafter, electric charges stored in the capacitor 3*b* are discharged via a diode 8 and a fourth resistor 9. Thereby, the charging voltage $V_C$ of the capacitor 3*b* falls at a predetermined time constant (=CR). As the charging voltage $V_C$ falls, the voltage $V_{R67}$ at point D which is a voltage input to the first CMOS inverter 23 falls. If the voltages $V_C$ and $V_{R67}$ rise again after the voltage $V_{R67}$ fell to or below the threshold value $V_{th}$ of the first CMOS inverter 23, the output of the first CMOS inverter 23 inverts from L-level to H-level, bringing the logic of the CMOS gate to its initial state.

At this stage, the charging voltage $V_C$ of the capacitor 3*b* is a value obtained when $V_{R67}$ in Equation 3 is replaced by the threshold value $V_{th}$ of the first CMOS inverter 23, and is expressed as in Equation 4.

$$V_C = V_{th} \times \frac{R_6 + R_7}{R_7} - \frac{V_{BAT} \times R_6}{R_7} \quad (4)$$

On the other hand, by the inversion of the logic of the CMOS gates, the voltage $V_{R67}$ at point D falls from the threshold value $V_{th}$ of the first CMOS inverter 23 in accordance with Equation 5.

$$V_{R67} = (V_C - V_{2OUT}) \times \frac{R_7}{R_6 + R_7} + V_{2OUT} \quad (5)$$

If the voltage $V_{2OUT}$ at point E is 0 in Equation 5, this equation can be rewritten as follows.

$$V_{R67} = V_C \times \frac{R_7}{R_6 + R_7} \quad (6)$$

When comparing the voltage $V_C$ at point B defined by Equation 1, i.e., the operation threshold value $V_T$ of the hysteresis circuit 25 with the voltage $V_C$ defined by Equation 4, the voltage $V_C$ defined by Equation 4 is lower than the voltage $V_C$ defined by Equation 1 by a width of hysteresis $\Delta V(=V_{BAT} \times R_6/R_7)$. The lower voltage value serves as a stop threshold value $V_S(<V_T)$ of the hysteresis circuit 25.

Figure 3:
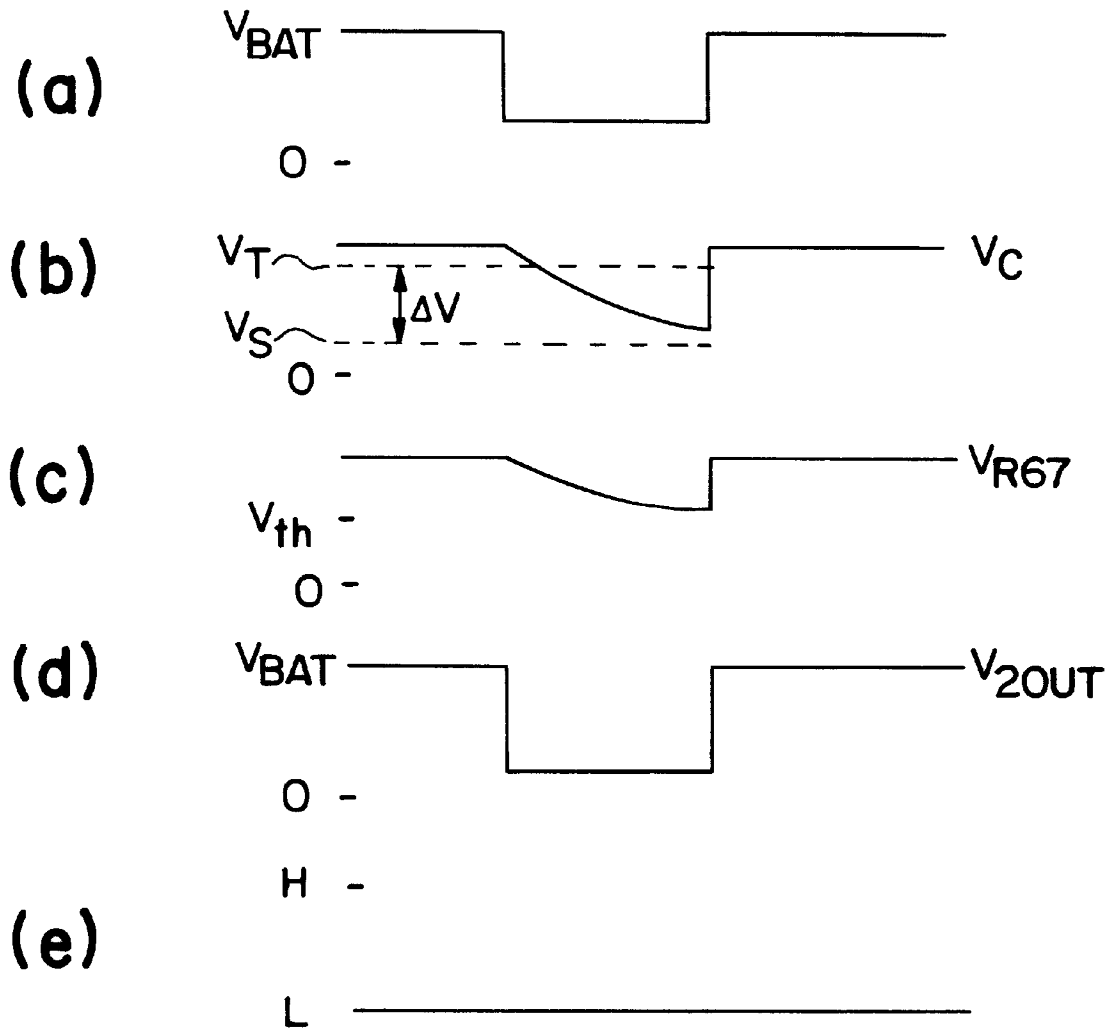
FIG. 3 is a chart showing the operation of the embodiment.

Accordingly, even if the source voltage $V_{BAT}$ falls for a certain reason by a certain amount but not to zero as shown in FIG. 3(*a*), and if thus the voltage $V_C$ at point B falls as shown in FIG. 3(*b*) and the voltage $V_{R67}$ at point D which is a voltage input to the first CMOS inverter 23 falls as shown in FIG. 3(*c*), the output of the first CMOS inverter 23 remains at L-level as shown in FIG. 3(*e*) even if the source voltage $V_{BAT}$ returns to its previous high level thereafter as shown in FIG. 3(*a*), unless the voltage $V_C$ at point B falls to or below the stop threshold value $V_S$ which is lower than the operation threshold value $V_T$ by $\Delta V$ as described above. The voltage $V_{2OUT}$ at point E which is a voltage output from the second CMOS inverter 24 varies as shown in FIG. 3(*d*).

Figure 5:
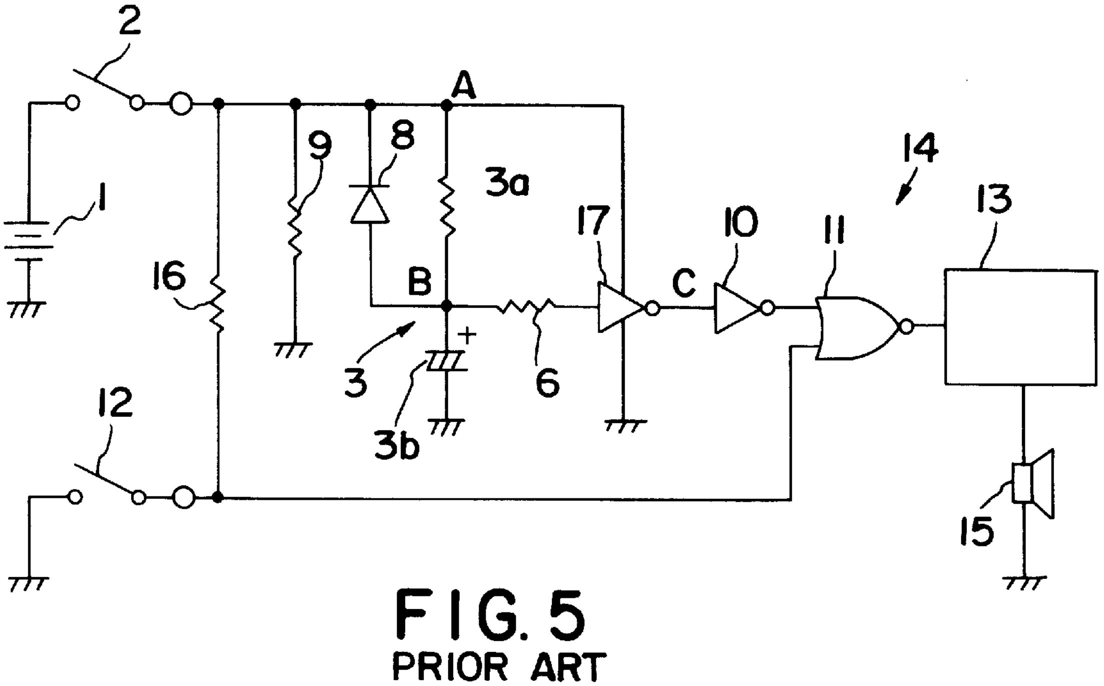
FIG. 5 PRIOR ART
FIG. 5 is a connection diagram of another prior art buzzer driving device.
Figure 6:
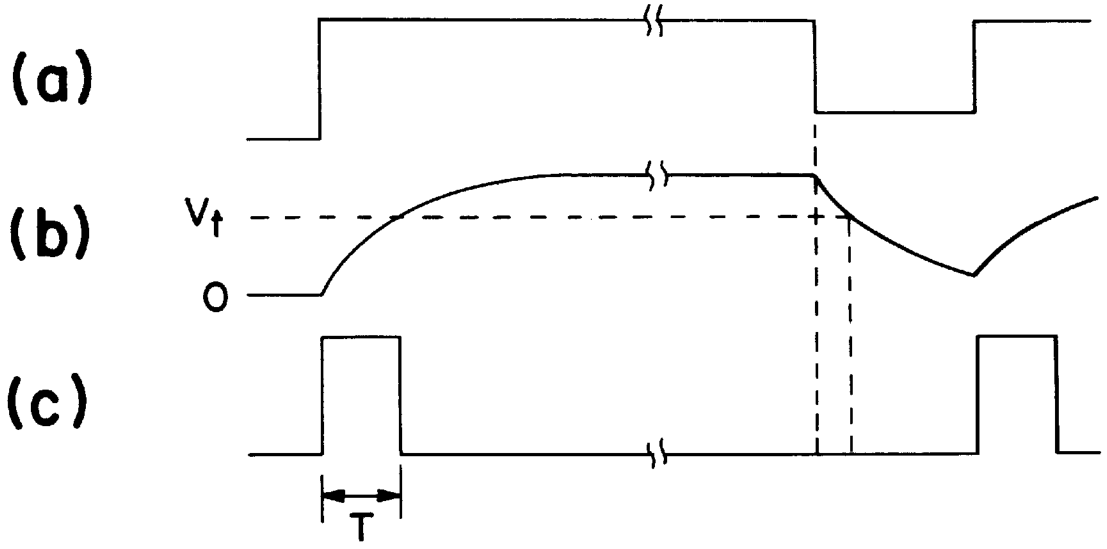
FIG. 6 PRIOR ART
FIG. 6 is a chart showing the operation of the prior art buzzer driving devices.

In the prior art construction, if the threshold value of the transistor 5 in FIG. 4 or that of the inverter 17 in FIG. 5 is lowered to become more resistant against the fall of the source voltage, the operation is likely to become unstable upon being influenced by the variation of the charging voltage of the capacitor 3*b* due to noises, etc. As opposed to the prior art construction, by the above-mentioned hysteresis according to the invention, the voltage fall threshold value $V_S$ is lower than the voltage rise threshold value $V_T$. In other words, a period which lasts until the voltage $V_C$ at point B reaches the stop threshold value $V_S(<V_T)$ after it starts falling due to the fall of the source voltage is longer than the period TH which lasts until the voltage $V_C$ at point B which is a voltage input to the hysteresis circuit 25 reaches the operation threshold value $V_T$ after it starts rising as shown in FIG. 2(*b*). Thus, the erroneous operation of the buzzer 15 caused by the variation of the source voltage and that of the charging voltage $V_C$ of the capacitor 3*b* due to noises can be suppressed.

According to this embodiment, even if the source voltage falls for a certain reason, the buzzer 15 does not operate unless the charging voltage of the capacitor 3*b* falls to or below the stop threshold value $V_S$ of the hysteresis circuit 25. Unlike the prior art device which drives the buzzer when it is not supposed to operate, the inventive buzzer driving device is capable of preventing the erroneous operation of the buzzer 15 and thus has an excellent reliability.

Although the foregoing embodiment is described with respect to a case where the invention is applied to the driving of a warning buzzer when the seat belt is not worn, it should be appreciated that the invention is applicable to other warning buzzers. The same effects can also be obtained in such cases.

Although the CMOS inverters are used in the foregoing embodiment, it should be appreciated that other types of inverters or inverters connected with a NAND gate having a plurality of input terminals and input terminals of a NOR gate may also be used.

As described above, according to the preferred embodiment of the invention, the hysteresis circuit is provided which operates until the output voltage of the charging/discharging circuit rises to or above an operation threshold value after the start of the charging of the charging/discharging circuit and thereafter remains inoperative unless the output voltage falls to or below the stop threshold value which is smaller than the operation threshold value due to the discharging of the charging/discharging circuit. Accordingly, when the source voltage falls for a certain reason and rises to its previous level thereafter, the buzzer does not operate, unless the output voltage of the charging/discharging circuit falls to or below the stop threshold value. Therefore, unlike the prior art buzzer driving devices which drive the buzzer when it should not operate, the erroneous operation of the buzzer can be prevented. Further, by constituting the charging/discharging circuit by the series circuit including the resistor and the capacitor and by constituting the hysteresis circuit by the first and second inverters such as CMOS inverters and the two voltage dividing resistors, there can be easily realized and provided the above buzzer driving device suitable for driving a variety of warning buzzers, particularly, of automotive vehicles.

What is claimed is:

1. A device connectable with a direct current source for driving a buzzer, comprising:

switch means for coupling said direct current source to said buzzer;

a charging/discharging circuit connected with the direct-current source via said switch means and which performs charging and discharging at a predetermined time constant (CR) when the switch means is turned on and off, respectively, and produces an output voltage in accordance therewith, said charging/discharging circuit comprising a series circuit having a charging/discharging resistor having a contact and a capacitor connected to said contact;

a hysteresis circuit to which said output voltage of the charging/discharging circuit is input and which operates while the output voltage rises to or above an operation threshold value ($V_T$) after the start of the charging of the charging/discharging circuit and thereafter becomes inoperative and remains inoperative unless the output voltage falls to or below a stop threshold value ($V_S$) which is smaller than the operation threshold value ($V_T$) due to the discharging of the charging/discharging circuit, the hysteresis circuit comprising a first inverter having an input terminal contact connected with said contact of the charging/discharging resistor and the capacitor via a first voltage dividing resistor and an output terminal contact connected with an input terminal of the driving circuit, and a second inverter having a source terminal contact connected with the direct-current source via the switch means, an input terminal connected with the output terminal contact of the first inverter, and an output terminal contact connected with the input terminal contact of the first inverter via a second voltage dividing resistor; and a driving circuit, connected between said hysteresis circuit and said buzzer for outputting a drive signal for said buzzer in response to the operation of the hysteresis circuit.

2. A buzzer driving device according to claim 1, further comprising a switch for connecting said driving circuit to ground.

3. A circuit for temporarily activating a warning device upon being connected through a switch with a direct current source, comprising:

charging/discharging circuit means, connected to said switch, for charging and discharging at a predetermined time constant when the switch means is closed and opened respectively turning access to said direct current source on and off and producing an output voltage in accordance therewith, said charging/discharging circuit means comprises a charging/discharging resistor, connected to said switch, and a capacitor connected between said charging/discharging resistor and ground;

hysteresis circuit means, connected to said charging/discharging circuit means and having an operation threshold and a stop threshold less than said operation threshold, for receiving said output voltage as an input voltage from said charging/discharging circuit means and producing an output signal while the magnitude of said input voltage rises to or above said operation threshold value after the start of the charging of said charging/discharging circuit means, and thereafter becoming inoperative and remaining inoperative unless said input voltage falls to or below said stop threshold value due to the discharging of the charging/discharging circuit means, said hysteresis circuit means comprises a first inverter having an output terminal, connected to an input terminal of said drive signal outputting means, and an input terminal, a first voltage dividing resistor connected at one end to said input terminal of said first inverter and at the other end to said charging/discharging circuit means between said charging/discharging resistor and said capacitor, a second inverter having a source terminal connected with the direct-current source through said switch, an input terminal connected to said output terminal of said first inverter, and an output terminal, a second voltage dividing resistor having one end connected to said input terminal of said first inverter and the other end connected to said output terminal of said second inverter; and means, connected to said hysteresis circuit means, for outputting a drive signal to activate said warning device in response to said output signal from said hysteresis circuit means.

4. A circuit as in claim 3, further comprising a second switch for connecting said means for outputting a drive signal to ground.

5. A method for temporarily activating a warning device upon being connected through a switch with a direct current source, comprising the steps of:

connecting a charging/discharging circuit to said switch, for charging and discharging at a predetermined time constant when the switch is closed and opened respectively turning access to said direct current source on and off, and producing an output voltage in accordance therewith, said charging/discharging circuit being formed by connecting a charging/discharging resistor to said switch, and connecting a capacitor between said charging/discharging resistor and ground;

connecting a hysteresis circuit to said charging/discharging circuit, which hysteresis circuit has an operation threshold and a stop threshold less than said operation threshold, for receiving said output voltage as an input voltage from said charging/discharging circuit and producing an output signal while the magnitude of said input voltage rises to or above said operation threshold value after the start of the charging of said charging/discharging circuit, and thereafter becoming inoperative remaining inoperative unless said input voltage falls to or below said stop threshold value due to the discharging of the charging/discharging circuit, said hysteresis circuit being formed by providing a first inverter having an input terminal and an output terminal and connecting said output terminal to an input terminal of said drive circuit, providing a first voltage dividing resistor and connecting one end to said input terminal of said first inverter and the other end to said charging/discharging circuit between said charging/discharging resistor and said capacitor, providing a second inverter having a source terminal, an input terminal and an output terminal, and connecting said source terminal with the direct-current source through said switch, connecting said input terminal to said output terminal of said first inverter, providing a second voltage dividing resistor and connecting one end to said input terminal of said first inverter and the other end to said output terminal of said second inverter; and connecting a drive circuit to said hysteresis circuit, for outputting a drive signal to activate said warning device in response to said output signal from said hysteresis circuit.

6. The method of claim 5, further comprising the step of providing a second switch for connecting said drive circuit to ground.

* * * * *